United States Patent [19]

Cooper et al.

[11] Patent Number: 5,670,915
[45] Date of Patent: Sep. 23, 1997

[54] ACCURATE RC OSCILLATOR HAVING PEAK - TO - PEAK VOLTAGE CONTROL

[75] Inventors: Russell E. Cooper; Scott Ellison, both of Chandler, Ariz.

[73] Assignee: Microchip Technology Incorporated, Chandler, Ariz.

[21] Appl. No.: 644,917

[22] Filed: May 24, 1996

[51] Int. Cl.$^6$ .................................................. H03K 3/0231
[52] U.S. Cl. ............................................. 331/111; 331/143
[58] Field of Search ............................. 331/108 D, 111, 331/143, 108 C

[56] References Cited

U.S. PATENT DOCUMENTS

| | | | |
|---|---|---|---|
| 4,122,413 | 10/1978 | Chen | 331/108 D |
| 4,407,588 | 10/1983 | Arichi et al. | 331/111 |
| 4,590,444 | 5/1986 | Wilcox | 331/111 |
| 4,983,931 | 1/1991 | Nakano | 331/111 |
| 5,036,300 | 7/1991 | Nicolai | 331/143 |

Primary Examiner—Siegfried H. Grimm
Attorney, Agent, or Firm—Harry M. Weiss; Jeffrey D. Moy; Harry M. Weiss & Associates, P.C.

[57] ABSTRACT

An accurate RC oscillator circuit located within a microcontroller chip for generating a signal of a predetermined frequency that accurately oscillates between two precise voltage levels, i.e., a low voltage (VL) and a high voltage (VH) is disclosed. The oscillator circuit uses first and second comparators having their outputs respectively coupled to set and reset inputs of a flip flop. The output of the flip flop is coupled to a series RC network for controlling the charging and discharging of the voltage across a capacitor of the RC network. The interconnection of the series RC network is coupled to an input of both the first and second comparators. The other input of the first comparator is coupled to a circuit for applying a modified high threshold version (VH') of the high voltage such that the signal generated by the oscillator circuit does not exceed the precise high voltage (VH). Similarly, the other input of the second comparator is coupled to a circuit for applying a modified low threshold version (VL') of the low voltage such that the signal generated by the oscillator circuit does not fall below that precise low voltage (VL). Additionally, means are provided to select different input voltages for the low voltage (VL) such that the desired output frequency of the oscillator may be adjusted to accurately oscillate between the high voltage (VH) and the selected low voltage (VL).

20 Claims, 1 Drawing Sheet

ACCURATE RC OSCILLATOR HAVING PEAK - TO - PEAK VOLTAGE CONTROL

RELATED APPLICATION

This patent application is related to pending U.S. patent application entitled "Accurate RC Oscillator," having Ser. No. 08/499,602 and a filing date of Jul. 11, 1995, now U.S. Pat. No. 5,565,819 in the name of Russell E. Cooper as inventor, and is incorporated herein by reference. This patent application is also related to pending U.S patent application Ser. No. 08/644,914, filed May 24, 1996, entitled "Microcontroller with Firmware Selectable Oscillator Trimming and a Method Therefor," and filed in the names of Richard Hull and Gregory Bingham as inventors and is incorporated herein by reference.

BACKGROUND OF THE INVENTION

1. Field of the Invention

This invention is in the field of oscillator circuits and methods for generating oscillatory signals and, more particularly, is an RC oscillator circuit for oscillating at a predetermined frequency by accurately oscillating between to precise voltages substantially independent of voltage, temperature, and process variations and a method therefore.

2. Description of the Related Art

Oscillator circuits are implemented in many different applications in the electronics field. RC oscillator circuits usually include a control circuit coupled to the interconnection between a series resistor-capacitor (RC) network. The control circuit alternately charges or discharges the voltage across the capacitor through the resistor to generate an oscillatory signal appearing across the capacitor. The frequency of oscillation is determined by the time constant of the resistor and capacitor.

One method for building an RC oscillator is to use a conventional NE555 timer (the 555 timer), manufactured by National Semiconductor, as the circuit that controls the charging and discharging of the capacitor of the RC network. The 555 timer includes a set/reset (SR) flip-flop and first and second comparators. The interconnection between the series RC network is coupled to one input of each of the comparators. The other input of the first comparator is coupled to receive a high threshold voltage (Vh) while the other input of the second comparator is coupled to receive a low threshold voltage (Vl). The output of the first comparator is coupled to the set input of the flip-flop while the output of the second comparator is coupled to the reset input of the flip-flop. An output of the flip-flop is coupled to the resistor of the RC network.

In operation, the first comparator sets the flip-flop, which commences the discharging of the voltage across the capacitor, when the RC oscillatory signal exceeds the predetermined high threshold voltage, and the second comparator resets the flip-flop, which commences the charging of the voltage across the capacitor, when the RC oscillatory signal falls below the predetermined low threshold voltage. In this manner, the signal appearing across the capacitor approximately oscillates between the high and low threshold voltages at a frequency determined by the value of the resistor and capacitor of the RC network.

However, such a configuration suffers from the drawback that by the time the flip-flop is set (or reset) in response to the switching of one of the comparators, the RC oscillatory signal has actually risen above the high threshold voltage (in the case of setting the flip-flop) or has fallen below the low threshold voltage (in the case of resetting the flip-flop). As a result, variations in the frequency of oscillation occur because the RC oscillatory signal does not accurately oscillate between the desired high and low threshold voltages. Such error can be unacceptable when an accurate oscillatory signal is required.

U.S. Pat. No. 4,122,413 to Chen (the "Chen '413 patent") discloses a single pin MOS RC oscillator circuit for oscillating between two threshold levels whose difference remains substantially constant. The RC oscillator circuit includes an external resistor and capacitor connected in series across power supply terminals of an integrated circuit (IC). The IC controls the charging and discharging of the capacitor. The IC is connected to the interconnection of the resistor and capacitor, and includes an MOS switch which is coupled across the capacitor when the switch is on, the voltage across the capacitor will discharge through the resistor, and when the switch is off, the capacitor is charged through the resistor. The IC also includes a pair of inverters having similar but different threshold values, coupled between the resistor and capacitor. Logic circuitry of the IC is coupled to the pair of inverters and configured such that the switch is as long as the capacitor voltage is below the threshold of both inverters, but the switch is "on" when the capacitor voltage exceeds both thresholds. Accordingly, the Chen '413 patent teaches that the voltage across the capacitor will oscillate between the two threshold voltages of the inverters at a frequency set by the RC time constant of the RC network. However, as stated in the Chen '413 patent, the threshold voltages of the inverters are not precise and will vary. However, the threshold voltages will vary in the same direction so that the difference between the threshold voltages will remain substantially constant. Accordingly, the frequency of oscillation remains substantially constant.

One area of particular interest in the oscillator art is that of implementing an oscillator with a microcontroller. In the past, most microcontroller users would rely on external oscillators to provide an accurate clock signal to the microcontroller. While this approach has the advantage of yielding an accurate clock signal to the microcontroller; it has the inherent disadvantages of higher costs associated with using an external clock source and inefficient use of space since an external oscillator and its associated components are required in addition to the microcontroller. Thus, it would be advantageous both in terms of cost reduction and space savings to have an oscillator internal to the microcontroller chip itself; however, those skilled in the art know that process variations inherent in the manufacturing procedure would ultimately yield an oscillator having an imprecise clock output frequency.

Therefore, there existed a need to provide a microcontroller having an internal RC oscillator circuit for providing a signal that oscillates at a predetermined frequency by accurately oscillating between precise high and low threshold voltage values while being substantially independent of temperature, power supply, and process variations and a method therefor.

SUMMARY OF THE INVENTION

An object of the present invention is to provide a microcontroller having an accurate internal RC oscillator and a method therefor.

Another object of the present invention is to provide a microcontroller having an accurate internal RC oscillator with digital trimming and a method therefor.

Yet another object of the present invention is to provide a microcontroller having an accurate internal. RC oscillator which provides a precise frequency clock signal substantially independent of temperature, voltage, and process variations and a method therefor.

BRIEF DESCRIPTION OF THE PREFERRED EMBODIMENTS

According to the present invention, a circuit is disclosed for generating an oscillatory signal of a predetermined frequency across a series resistor-capacitor (RC) network by ensuring that the oscillatory signal accurately oscillates between first and second voltages generated from a supply voltage source where the frequency of oscillation is determined by both the time constant of the RC network and the difference between the first and second voltages, comprising, in combination, charging-discharging means for discharging a voltage across the capacitor commencing when voltage of the oscillatory signal exceeds a first threshold voltage and for charging the voltage across the capacitor commencing when voltage of the oscillatory signal falls below a second threshold voltage, first sampling means coupled to the charging-discharging means for obtaining a first sampled voltage of the oscillatory signal upon commencement of discharging of the voltage across the capacitor, first compensation means coupled to the first sampling means for adjusting the first threshold voltage to be the first voltage modified by a voltage difference between the first voltage and the first sampled voltage, second sampling means coupled to the charging-discharging means for obtaining a second sampled voltage of the oscillatory signal upon commencement of charging of the voltage across the capacitor, second compensation means coupled to the second sampling means for adjusting the second threshold voltage to be the second voltage modified by a voltage difference between the second voltage and the second sampled voltage, and differential voltage setting means coupled to the second compensation means for selecting the second voltage from a plurality of different possible voltages and thereby selecting a voltage difference between the first and second voltages. The charging-discharging means comprises a flip flop having an output thereof coupled to the series RC network for controlling the charging and discharging of the voltage across the capacitor.

The first sampling means comprises a negatively-triggered pulse generator having an input connected to an output of the charging-discharging means, and first switch means coupled to an output of the negatively triggered pulse generator for momentarily coupling, in response to receipt of a pulse from the negatively-triggered pulse generator, the first compensation means to the first sampled voltage of the oscillatory signal. Similarly, the second sampling means comprises a positively-triggered pulse generator having an input connected to an output of the charging-discharging means, and second switch means coupled to an output of the positively-triggered pulse generator for momentarily coupling, in response to receipt of a pulse from the positively-triggered pulse generator, the second compensation means to the second sampled voltage of the oscillatory signal.

The circuit of the instant invention further comprises first and second comparators having their outputs respectively coupled to first and second inputs of the flip flop for setting and resetting the flip flop, the first comparator having a connection from its non-inverting input to a node between a resistor and the capacitor of the RC network, and the second comparator having a connection from its inverting input to the node. The first compensation means comprises an amplifier having first and second inputs and an output, the first input of the amplifier being coupled to receive the first voltage, and the output of the amplifier being coupled to an inverting input of the first comparator, and a capacitor coupled at one end to the output of the amplifier and coupled at the other end to the second input of the amplifier. Similarly, the second compensation means comprises an amplifier having first and second inputs and an output, the first input of the amplifier being coupled to receive the second voltage, and the output of the amplifier being coupled to the non-inverting input of the second comparator, and a capacitor coupled at one end to the output of the amplifier and coupled at the other end to the second input of the amplifier.

The differential voltage setting means comprises a multiplexer coupled at an input thereof to the supply voltage source and having an output supplying the second voltage to the amplifier of the second compensation means. The multiplexer has a plurality of input taps each supplying a different voltage from the multiplexer to the amplifier of the second compensation means when selected. Additionally, the multiplexer includes selection means for selecting one of the plurality of input taps.

Alternatively, the present invention discloses a method for generating an oscillatory signal of a predetermined frequency across a series resistor-capacitor (RC) network by ensuring that the oscillatory signal accurately oscillates between first and second voltages generated from a supply voltage source where the frequency of oscillation is determined by both the time constant of the RC network and the difference between the first and second voltages comprising the steps of providing charging-discharging means for discharging a voltage across the capacitor commencing when voltage of the oscillatory signal exceeds a first threshold voltage and for charging the voltage across the capacitor commencing when voltage of the oscillatory signal falls below a second threshold voltage, providing first sampling means coupled to the charging-discharging means for obtaining a first sampled voltage of the oscillatory signal upon commencement of discharging of the voltage across the capacitor, providing first compensation means coupled to the first sampling means for adjusting the first threshold voltage to be the first voltage modified by a voltage difference between the first voltage and the first sampled voltage, providing second sampling means coupled to the charging-discharging means for obtaining a second sampled voltage of the oscillatory signal upon commencement of charging of the voltage across the capacitor, providing second compensation means coupled to the second sampling means for adjusting the second threshold voltage to be the second voltage modified by a voltage difference between the second voltage and the second sampled voltage, and providing differential voltage setting means coupled to the second compensation means for selecting the second voltage from a plurality of different possible voltages and thereby selecting a voltage difference between the first and second voltages. The charging-discharging means comprises a flip flop having an output thereof coupled to the series RC network for controlling the charging and discharging of the voltage across the capacitor.

The step of providing the first sampling means comprises the steps of providing a negatively-triggered pulse generator having an input connected to an output of the charging-discharging means, and providing first switch means coupled to an output of the negatively triggered pulse generator for momentarily coupling, in response to receipt of a pulse from the negatively-triggered pulse generator, the first compensation means to the first sampled voltage of the oscillatory signal. Similarly, the step of providing the second sampling means comprises the steps of providing a positively-triggered pulse generator having an input connected to an output of the charging-discharging means, and providing second switch means coupled to an output of the positively-triggered pulse generator for momentarily coupling, in response to receipt of a pulse from the positively-triggered pulse generator, the second compensation means to the second sampled voltage of the oscillatory signal.

This method further includes the step of providing first and second comparators having their outputs respectively coupled to first and second inputs of the flip flop for setting and resetting the flip flop, the first comparator having a connection from its non-inverting input to a node between a resistor and the capacitor of the RC network, and the second comparator having a connection from its inverting input to the node. The step of providing the first compensation means comprises the steps of providing an amplifier having first and second inputs and an output, the first input of the amplifier being couple to receive the first voltage, and the output of the amplifier being coupled to an inverting input of the first comparator, and providing a capacitor coupled at one end to the output of the amplifier and coupled at the other end to the second input of the amplifier. Similarly, the step of providing the second compensation means comprises the steps of providing an amplifier having first and second inputs and an output, the first input of the amplifier being coupled to receive the second voltage, and the output of the amplifier being coupled to the non-inverting input of the second comparator, and providing a capacitor coupled at one end to the output of the amplifier and coupled at the other end to the second input of the amplifier.

The differential voltage setting means comprises a multiplexer coupled at an input thereof to the supply voltage source and having an output supplying the second voltage to the amplifier of the second compensation means. Additionally, the multiplexer has a plurality of input taps each supplying a different voltage from the multiplexer to the amplifier of the second compensation means when selected.

The foregoing and other objects, features, and advantages of the invention will be apparent from the following, more particular, description of the preferred embodiments of the invention, as illustrated in the accompanying drawings.

DESCRIPTION OF THE PREFERRED EMBODIMENTS

Figure 1:
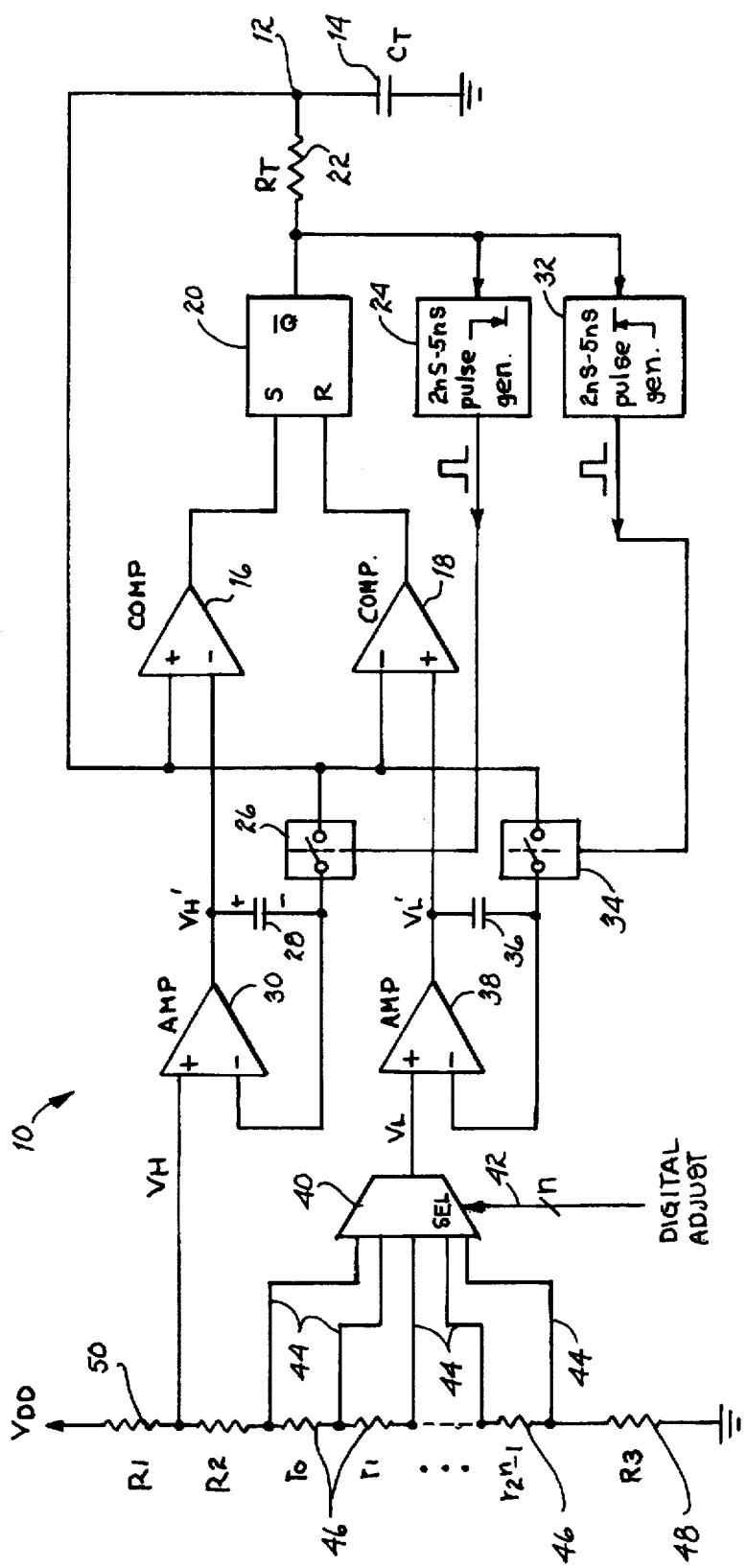
FIG. 1 is simplified electrical schematic view of the RC oscillator which is located within a microcontroller chip (not shown for simplicity)

Referring to FIG. 1, the accurate RC oscillator having peak-to-peak voltage control (hereinafter referred to simply as the oscillator) is shown and designated by general reference number 10. The oscillator 10 is situated on a chip with a microcontroller (not shown), and this is a key feature of the claimed invention since no external, separate oscillator is required with the microcontroller of the instant invention. The oscillator 10 generates an oscillatory signal of a predetermined frequency by accurately oscillating between precise predetermined voltage levels, for example, predetermined first and second or high and low voltages (VH and VL) respectively. The oscillator 10 generates an oscillatory signal at circuit node 12 (i.e., across capacitor 14), that accurately oscillates between high and low voltage values (VH and VL). The frequency of oscillation is determined, in part, by the RC time constant of the resistor 22 and the capacitor 14 wherein the frequency of oscillation is inversely proportional to the product of the resistance and capacitance associated with resistor 22 and capacitor 14, respectively. The frequency of oscillation is also affected by the difference between the high and low voltages (VH and VL) since the oscillatory signal at node 12 precisely alternates, peak-to-peak between these voltages. More particularly, for a given RC time constant associated with resistor 22 and capacitor 14, as the voltage difference between VH and VL becomes lower, the frequency of oscillation increases, and vice versa.

The oscillator 10 includes comparators 16 and 18 and SR flip flop 20 all of which comprise the components of a conventional 555 timer. Comparators 16 and 18 have outputs respectively coupled to the set and reset inputs of SR flip flop 20, which can be thought of as a charging-discharging portion for the oscillator 10. Circuit node 12, which is the interconnection of the RC network comprised of capacitor 14 and resistor 22, is coupled to the non-inverting input of comparator 16 and the inverting input of comparator 18. The inverting input of comparator 16 is coupled to receive a modified version of the high voltage (VH), as represented by high threshold voltage (VH'). Likewise, the non-inverting input of comparator 18 is coupled to receive a modified version of the low voltage (VL), as represented by low threshold voltage (VL').

An inverting output flip flop 20 is coupled through resistor 22 to circuit node W12. The output of flip flop 20 switches between the supply voltages applied to flip flop 20, for example, between commonly referred to voltages of Vdd and Vss, depending of whether the flip flop is being set or reset. For example, when flip flop 20 is set, the inverting output of flip flop 20 switches from a logic 1 to a logic 0 and, thus, transitions from voltage Vdd to voltage Vss.

It is noteworthy that although the preferred embodiment utilizes the inverting output of flip flop 20, the non-inverting output (not shown) of flip flop 20 could have been used wherein the connections from comparators 16 and 18 to the set and reset inputs of flip flop 20 would be reversed. Alternatively, the inputs of each comparator 16 and 18 could be swapped to provide inverted polarity at their respective outputs.

The oscillator 10 includes a first voltage modifying portion comprising a first sampling portion and a first compensation portion. Similarly, the oscillator 10 includes a second voltage modifying portion, comprising a second sampling portion and a second compensation portion. The first and second voltage modifying portions generate modified high and low threshold voltages (VH' and VL') for application to comparators 16 and 18, respectively, based upon the overshoot (of voltage VH) or undershoot (of voltage VL) of the oscillatory signal appearing at circuit node 12 when flip flop 20 switches. In particular, the first voltage modifying portion generates and applies a modified high threshold voltage VH' to the inverting input of comparator 16 so that by the time flip flop 20 actually switches in response to the oscillatory signal exceeding modified high threshold voltage VH', the oscillatory signal is substantially equal to the predetermined high voltage VH. Similarly, the second voltage modifying portion generates and applies a modified low threshold voltage VL' to the non-inverting input of comparator 18 so that by the time flip flop 20 actually switches in response to the oscillatory signal falling below modified low threshold voltage VL', the oscillatory signal is substantially equal to the predetermined low voltage VL. In this manner, the instant invention provides a signal appearing at circuit node 12 that accurately oscillates between voltages VL and VH. This ensures that the signal at circuit node 12 oscillates at a predetermined and substantially constant frequency.

As previously stated, the first voltage modifying portion includes the first sampling portion and the first compensation portion. The first sampling portion comprises a negatively-triggered pulse generator 24 having an input connected to an output of the charging-discharging portion or flip flop 20, and a first switch portion 26 coupled to an output of the negatively triggered pulse generator 24 for momentarily coupling, in response to receipt of a pulse from the negatively-triggered pulse generator 24, the first compensation portion to a first sampled voltage of the oscillatory signal. The negatively triggered pulse generator 24 provides an output pulse of approximately 2–5 nanosecond duration in response to receipt at its input of the falling edge of the output signal from flip flop 20. Pulse generators such as negatively triggered pulse generator 24 are well known to those skilled in the art. The first compensation portion comprises an amplifier 30 and a capacitor 28. The first input of the amplifier is coupled to receive the first or high voltage (VH), and the output of the amplifier 30 is coupled to the inverting input of the first comparator 16. The capacitor 28 is coupled at one end to the output of the amplifier 30, and coupled at the other end to the second input of the amplifier 30.

In operation, amplifier 30 is coupled in a unity gain configuration with feedback capacitor 28 such that the voltage across capacitor 28 is the voltage difference between VH' and VH, since amplifier 30 maintains the voltages appearing at its inverting and non-inverting inputs substantially equal. Further, voltage VH' is initially set to equal voltage VH. However, when flip flop 20 switches from a logic high to a logic low, switch 26 momentarily closes (due to negatively triggered pulse generator and connects circuit node 12 to a first terminal of capacitor 28. This forces a sample of the voltage appearing at circuit node 12 (i.e., voltage of the oscillatory signal) to appear at the first terminal of capacitor 28. Accordingly, the voltage across capacitor 28 will change by the difference between the voltage sampled at circuit node 12 and voltage VH such that the voltage across the capacitor becomes more positive if VH>(voltage at circuit node 12) and less positive if VH<(voltage at circuit node 12). In this manner, the capacitor 28 effectively stores this voltage difference. Moreover, once VH=(voltage at circuit node 12) at the sample time, the voltage across capacitor 28 will not change and the overshoot condition will have been corrected.

In particular, when the oscillatory signal overshoots voltage VH, the first sampled voltage appearing at the first terminal of capacitor 28 will be greater then voltage VH. Accordingly, amplifier 30 will respond by lowering the voltage across capacitor 28, and, thus, lowering voltage VH' by the amount of the voltage overshoot. In other words, amplifier 30 generates modified high threshold voltage VH' that is equal to the voltage difference between the first sampled voltage at circuit node 12 and voltage VH and applies this voltage VH' to comparator 16. Moreover, because the sample time is very short (i.e., on the order of 2–5 nanoseconds), it may take a few iterations from start-up before the oscillatory signal precisely reaches the high voltage VH without overshoot. Thereafter, however, comparator 16 will switch when the voltage at circuit node 12 exceeds voltage VH' such that by the time flip flop 20 actually switches and begins to discharge the voltage at circuit node 12, the voltage at circuit node 12 has accurately and precisely reached the desired high value of VH.

Similarly, as previously stated, the second voltage modifying portion includes the second sampling portion and the second compensation portion. The second sampling portion comprises a positively-triggered pulse generator 32 having an input connected to an output of the charging-discharging portion or flip flop 20, and a second switch portion or simply switch 34 coupled to an output of the positively-triggered pulse generator 32 for momentarily coupling, in response to receipt of a pulse from the positively-triggered pulse generator 32, the second compensation portion to a second sampled voltage of the oscillatory signal. The positively triggered pulse generator 32 provides an output pulse of approximately 2–5 nanosecond duration in response to receipt at its input of the rising edge of the output signal from flip flop 20. Pulse generators such as positively triggered pulse generator 32 are well known to those skilled in the art. The second compensation portion comprises an amplifier 38 and a capacitor 36. The first input of the amplifier 38 is coupled to receive the second or low voltage (VL), and the output of the amplifier 38 is coupled to the non-inverting input of the second comparator 18. The capacitor 36 is coupled at one end to the output of the amplifier 38, and coupled at the other end to the second input of the amplifier 38.

Similar to amplifier 30, amplifier 38 is coupled in a unity gain configuration with feedback capacitor 36 such that the voltage across capacitor 36 is the voltage difference between VL' and VL. Further, voltage VL' is initially set to equal voltage VL. When flip flop 20 switches from a logic low to a logic high, switch 34 momentarily closes (due to positively triggered pulse generator 32) and connects circuit node 12 to the first terminal of capacitor 36. This forces a sample of the voltage appearing at circuit node 12 to appear at the first terminal of capacitor 36. Accordingly, the voltage across capacitor 36 will change by the difference between the voltage sampled at circuit node 12 and voltage VL, and capacitor 36 effectively stores this voltage difference. For example, when the oscillatory signal undershoots voltage VL, the sampled voltage appearing at the first terminal of capacitor 36 will be less than voltage VL. Accordingly, amplifier 38 will respond by increasing the voltage across capacitor 36 and, thus, increasing voltage VL' by the voltage amount equal to the voltage difference between the second sampled voltage and voltage VL and apply this voltage to comparator 18. Again, because the sample time is very short (i.e., 2–5 nanoseconds), it may take a few iterations before the oscillatory signal precisely reaches the low voltage VL with no undershoot. Thereafter, comparator 18 will switch when the voltage at circuit node 12 exceeds voltage VL' such that by the time flip flop 20 actually switches and begins to charge the voltage at circuit node 12, the voltage at circuit node 12 has accurately reached the desired low voltage VL.

The portions of the oscillator 10 discussed up until this point provide a signal which oscillates at a predetermined frequency between low and high voltages VL and VH. Since the frequency of the oscillating signal is a function of both the RC time constant associated with resistor 22 and capacitor 14 and the voltage difference between the voltages VL and VH, controlling this voltage difference will also control the frequency of the oscillating signal from the oscillator 10. Thus, the differential voltage setting portion is provided for selecting the second or low voltage (VL) from a plurality of different possible voltages, thereby selecting the voltage difference between the first or high (VH) and second or low (VL) voltages. The differential voltage setting portion comprises a multiplexer 40 coupled at an input thereof to the supply voltage source Vdd and having an output supplying the second or low voltage (VL) to amplifier 38 of the second compensation portion. The multiplexer 40 has a plurality of input taps 44 each supplying a different voltage from the multiplexer 40 to the amplifier 38 when selected. The multiplexer 40 includes a selection or digital adjust portion 42 for selecting one of the plurality of input taps 44. The digital adjust portion 42 comprises n lines of digital data for the multiplexer 40. Thus, the digital adjust portion 42 can address $2^n$ input taps 44 from R0 to R($2^n$−1). Between each input tap 44 is another resistor 46 to provide different voltage levels to the multiplexer 40. Also note that between the voltage source Vdd and ground are setting resistors 48 and 50. The digital adjust portion 42 data can be provided from memory on the microcontroller chip or from other sources, as desired.

Figure 2:
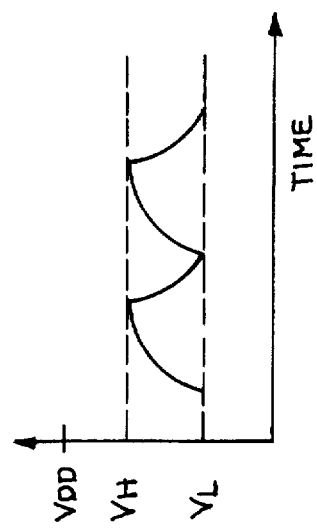
FIG. 2 is a graphical diagram showing an exemplary oscillatory signal of the instant invention.

Referring to FIG. 2 a graphical diagram shows an exemplary oscillatory signal of the instant invention wherein the signal oscillates between predetermined high and low voltages VH and VL.

Although the invention has been particularly shown and described with reference to a preferred embodiment thereof, it will be understood by those skilled in the art that changes in form and detail may be made therein without departing from the spirit and scope of the invention.

What is claimed is:

1. A circuit for generating an oscillatory signal of a predetermined frequency across a series resistor-capacitor (RC) network by ensuring that the oscillatory signal accurately oscillates between first and second voltages generated from a supply voltage source where the frequency of oscillation is determined by both the time constant of the RC network and the difference between the first and second voltages, comprising, in combination:

charging-discharging means for discharging a voltage across the capacitor commencing when voltage of the oscillatory signal exceeds a first threshold voltage and for charging said voltage across the capacitor commencing when voltage of the oscillatory signal falls below a second threshold voltage;

first sampling means coupled to said charging-discharging means for obtaining a first sampled voltage of the oscillatory signal upon commencement of discharging of said voltage across the capacitor;

first compensation means coupled to said first sampling means for adjusting said first threshold voltage to be the first voltage modified by a voltage difference between the first voltage and said first sampled voltage;

second sampling means coupled to said charging-discharging means for obtaining a second sampled voltage of the oscillatory signal upon commencement of charging of said voltage across the capacitor;

second compensation means coupled to said second sampling means for adjusting said second threshold voltage to be the second voltage modified by a voltage difference between the second voltage and said second sampled voltage; and differential voltage setting means coupled to said second compensation means for selecting the second voltage from a plurality of different possible voltages and thereby selecting a voltage difference between the first and second voltages.

2. The circuit of claim 1 wherein said charging-discharging means comprises a flip flop having an output thereof coupled to the series RC network for controlling the charging and discharging of said voltage across the capacitor.

3. The circuit of claim 1 wherein said first sampling means comprises:

a negatively-triggered pulse generator having an input connected to an output of said charging-discharging means; and first switch means coupled to an output of said negatively triggered pulse generator for momentarily coupling, in response to receipt of a pulse from said negatively-triggered pulse generator, said first compensation means to said first sampled voltage of the oscillatory signal.

4. The circuit of claim 1 wherein said second sampling means comprises:

a positively-triggered pulse generator having an input connected to an output of said charging-discharging means; and second switch means coupled to an output of said positively-triggered pulse generator for momentarily coupling, in response to receipt of a pulse from said positively-triggered pulse generator, said second compensation means to said second sampled voltage of the oscillatory signal.

5. The circuit of claim 2 further comprising first and second comparators having their outputs respectively coupled to first and second inputs of said flip flop for setting and resetting said flip flop, said first comparator having a connection from its non-inverting input to a node between a resistor and the capacitor of the RC network, and said second comparator having a connection from its inverting input to said node.

6. The circuit of claim 5 wherein said first compensation means comprises:

an amplifier having first and second inputs and an output, said first input of said amplifier being coupled to receive the first voltage, and said output of said amplifier being coupled to an inverting input of said first comparator; and a capacitor coupled at one end to the output of the amplifier and coupled at the other end to the second input of the amplifier.

7. The circuit of claim 6 wherein said second compensation means comprises:

an amplifier having first and second inputs and an output, said first input of said amplifier being coupled to receive the second voltage; and said output of said amplifier being coupled to the non-inverting input of said second comparator; and a capacitor coupled at one end to the output of the amplifier and coupled at the other end to the second input of the amplifier.

8. The circuit of claim 7 wherein said differential voltage setting means comprises a multiplexer coupled at an input thereof to the supply voltage source and having an output supplying the second voltage to said amplifier of said second compensation means.

9. The circuit of claim 8 wherein said multiplexer has a plurality of input taps each supplying a different voltage from said multiplexer to said amplifier of said second compensation means when selected.

10. The circuit of claim 9 wherein said multiplexer includes selection means for selecting one of said plurality of input taps, and wherein said circuit is located on a chip with a microcontroller.

11. A method for generating an oscillatory signal of a predetermined frequency across a series resistor-capacitor (RC) network by ensuring that the oscillatory signal accurately oscillates between first and second voltages generated from a supply voltage source where the frequency of oscillation is determined by both the time constant of the RC network and the difference between the first and second voltages comprising the steps of:

provinding charging-discharging means for discharging a voltage across the capacitor commencing when voltage of the oscillatory signal exceeds a first threshold voltage and for charging said voltage across the capacitor commencing when voltage of the oscillatory signal falls below a second threshold voltage;

providing first sampling means coupled to said charging-discharging means for obtaining a first sampled voltage of the oscillatory signal upon commencement of discharging of said voltage across the capacitor;

providing first compensation means coupled to said first sampling means for adjusting said first threshold voltage to be the first voltage modified by a voltage difference between the first voltage and said first sampled voltage;

providing second sampling means coupled to said charging-discharging means for obtaining a second sampled voltage of the oscillatory signal upon commencement of charging of said voltage across the capacitor;

providing second compensation means coupled to said second sampling means for adjusting said second threshold voltage to be the second voltage modified by a voltage difference between the second voltage and said second sampled voltage; and providing differential voltage setting means coupled to said second compensation means for selecting the second voltage from a plurality of different possible voltages and thereby selecting a voltage difference between the first and second voltages.

12. The method of claim 11 wherein said charging-discharging means comprises a flip flop having an output thereof coupled to the series RC network for controlling the charging and discharging of said voltage across the capacitor.

13. The method of claim 11 wherein the step of providing said first sampling means comprises the steps of:

providing a negatively-triggered pulse generator having an input connected to an output of said charging-discharging means; and providing first switch means coupled to an output of said negatively triggered pulse generator for momentarily coupling, in response to receipt of a pulse from said negatively-triggered pulse generator, said first compensation means to said first sampled voltage of the oscillatory signal.

14. The method of claim 11 wherein the step of providing said second sampling means comprises the steps of:

providing a positively-triggered pulse generator having an input connected to an output of said charging-discharging means; and providing second switch means coupled to an output of said positively-triggered pulse generator for momentarily coupling, in response to receipt of a pulse from said positively-triggered pulse generator, said second compensation means to said second sampled voltage of the oscillatory signal.

15. The method of claim 12 further comprising the step of providing first and second comparators having their outputs respectively coupled to first and second inputs of said flip flop for setting and resetting said flip flop, said first comparator having a connection from its non-inverting input to a node between a resistor and the capacitor of the RC network, and said second comparator having a connection from its inverting input to said node.

16. The method of claim 15 wherein the step of providing said first compensation means comprises the steps of:

providing an amplifier having first and second inputs and an output, said first input of said amplifier being coupled to receive the first voltage, and said output of said amplifier being coupled to an inverting input of said first comparator; and providing a capacitor coupled at one end to the output of the amplifier and coupled at the other end to the second input of the amplifier.

17. The method of claim 15 wherein the step of providing said second compensation means comprises the steps of:

providing an amplifier having first and second inputs and an output, said first input of said amplifier being coupled to receive the second voltage, and said output of said amplifier being coupled to the non-inverting input of said second comparator; and providing a capacitor coupled at one end to the output of the amplifier and coupled at the other end to the second input of the amplifier.

18. The method of claim 17 wherein said differential voltage setting means comprises a multiplexer coupled at an input thereof to the supply voltage source and having an output supplying the second voltage to said amplifier of said second compensation means.

19. The method of claim 18 wherein said multiplexer has a plurality of input taps each supplying a different voltage from said multiplexer to said amplifier of said second compensation means when selected.

20. A circuit for generating an oscillatory signal of a predetermined frequency across a series resistor-capacitor (RC) network by ensuring that the oscillatory signal accurately oscillates between first and second voltages generated from a supply voltage source and where the frequency of oscillation is determined by both the time constant of the RC network and by the difference between the first and second voltages, the circuit including first and second comparators having their outputs respectively coupled to first and second inputs of a flip flop for setting and resetting the flip flop, an output of the flip flop being coupled to the series RC network for controlling the charging and discharging of voltage across the capacitor, the interconnection of the series RC network being coupled to an input of both the first and second comparators, the improvement comprising:

first voltage modifying means for receiving the first voltage and for applying a modified version of the first voltage to the other input of the first comparator such that the first comparator switches before the oscillatory signal actually reaches the first voltage thereby ensuring that the oscillatory signal precisely reaches the first voltage by the time the flip flop switches;

second voltage modifying means for receiving the second voltage and for applying a modified version of the second voltage to the other input of the second comparator such that the second comparator switches before the oscillatory signal actually reaches the second voltage thereby ensuring that the oscillatory signal precisely reaches the second voltage by the time the flip flop switches;

differential voltage setting means coupled to said second voltage modifying means for selecting the second voltage from a plurality of different possible voltages and thereby selecting a voltage difference between the first and second voltages; and said circuit being located on a chip with a microcontroller.

* * * * *